United States Patent [19]

Takekoshi

[11] Patent Number: 4,607,251

[45] Date of Patent: Aug. 19, 1986

[54] MATRIX SWITCH APPARATUS INCLUDING PULL-UP RESISTORS FOR SENSE LINES

[75] Inventor: Toshio Takekoshi, Isehara, Japan

[73] Assignee: Hitachi, Ltd., Tokyo, Japan

[21] Appl. No.: 613,630

[22] Filed: May 24, 1984

[30] Foreign Application Priority Data

May 24, 1983 [JP] Japan ................................. 58-90981

[51] Int. Cl.⁴ ............................................. H04L 1/00
[52] U.S. Cl. ............................ 340/365 S; 340/825.79
[58] Field of Search ................... 178/17 C; 179/90 K; 307/247 R, 572, 582; 340/825, 79, 825.9, 825.91, 825.85, 365 R, 365 S, 365 C, 365 E, 711, 712, 825.77

[56] References Cited

U.S. PATENT DOCUMENTS

| | | | |
|---|---|---|---|
| 3,816,770 | 6/1974 | Nakamura | 340/365 EX |
| 3,990,070 | 11/1976 | Spence | 340/711 |
| 4,075,621 | 2/1978 | Salmon | 340/711 |
| 4,234,872 | 11/1980 | Halder | 340/365 R |
| 4,318,087 | 3/1982 | Wilson | 340/365 S |

*Primary Examiner*—Ulysses Weldon
*Attorney, Agent, or Firm*—Antonelli, Terry & Wands

[57] ABSTRACT

A system is provided for detecting closed contacts in a matrix switch made by using, for example, transparent conductive sheets. According to the present invention, switching elements are parallel-connected to resistors which are used to pull up the electric potentials of sense lines. These switching elements are suitably turned on to expedite the electric potentials of the sense lines. This enables the detection of closed contacts to be done correctly even when an operational speed is increased.

7 Claims, 5 Drawing Figures

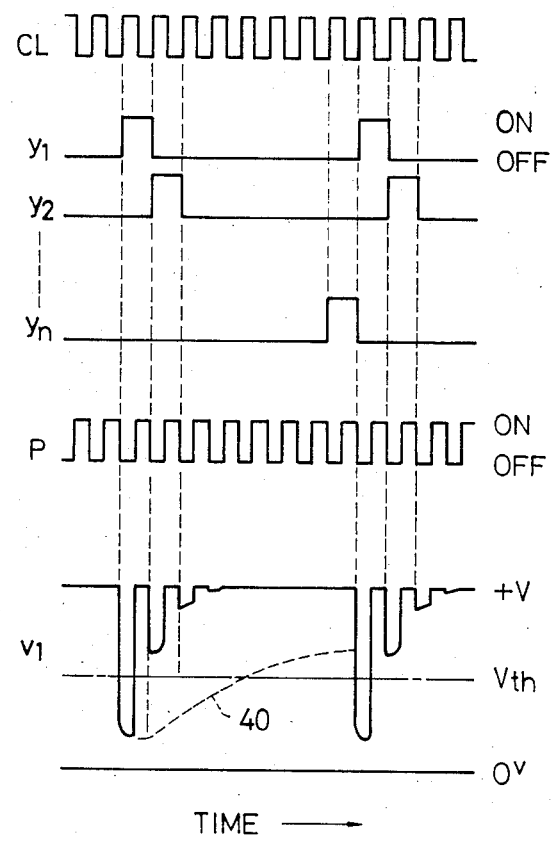

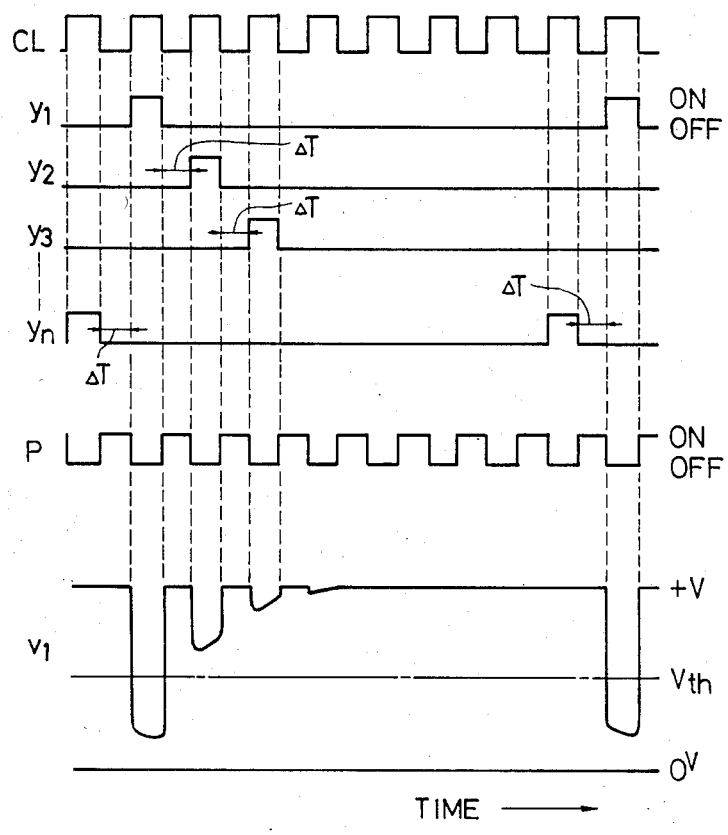

MATRIX SWITCH APPARATUS INCLUDING PULL-UP RESISTORS FOR SENSE LINES

BACKGROUND OF THE INVENTION

1. Field of the Invention

This invention relates to a system for detecting closed contacts in a matrix switch.

2. Description of the Prior Art

A matrix switch formed by arranging a plurality of switch contacts in the shape of an XY matrix by using a transparent conductive sheet is generally known.

FIG. 1 is a sectional view showing the construction of such a matrix switch. Referring to FIG. 1, reference numerals 1, 2 denote transparent conductive sheets in each of which a plurality of conductive layers 3 are formed in parallel with one another on a transparent sheet member of a synthetic resin. Since the conductive layers 3 are formed to a small thickness by evaporation, even the portions of the transparent conductive sheets 1, 2 which correspond thereto are transparent. These transparent conductive sheets 1, 2 are laminated on each other with the conductive layers 3 positioned on the inner side of the resultant lamination in such a manner that the conductive layers 3 on one transparent sheet member cross those on the other; the lamination as a whole constitutes a transparent structure. The conductive layers 3 in one transparent conductive sheet are used as sense lines (X lines), and the conductive layers 3 in the other as driving lines (Y lines). The intersections of these conductive layers function as contacts in a switch. Such a matrix switch is placed on a display panel on a light-emitting display, such as a plasma display, and used as an input device of the type in which information is inputted by pressing by a finger the intersections corresponding to letters and symbols indicated on the display panel.

Such a matrix switch generally employs a sense system, in which the sense lines (X lines) are pulled up to a predetermined electric potential through resistors to monitor variations in the electric potentials of the sense lines while grounding the driving lines (Y lines) in order by a switching element or connecting the driving lines to predetermined electric potential points (scanning), to thereby detect closed contacts.

However, when this sense system is applied to a switch matrix having a high resistance value (for example, 100 KΩ) while the switch is on, such as a switch matrix using indium oxide as an evaporation material for its conductive layers, the scanning speed is restricted greatly or closed contacts are detected erroneously. Namely, when a resistance value is high while the switch is on, it is necessary to increase the resistance values of the pulling-up resistors as well for increasing the amplitude of the electric potential of the sense lines. This causes the time constant of a circuit including the sense lines to increase. Consequently, after the scanning of a certain closed contact has been completed, the electric potential of the sense line connected to the closed contact is not recovered immediately, and, therefore, when the scanning time is short, another contact connected to the same sense line is detected erroneously as a closed contact during the scanning thereof.

SUMMARY OF THE INVENTION

An object of the present invention is to provide a matrix switch sense system capable of solving the above-mentioned problems.

According to the present invention, switching elements are parallel-connected to pull-up resistors for a sense line and turned on in a suitable manner to expedite the recovery of the electric potential of the sense line and thereby solve the abovementioned problems.

BRIEF DESCRIPTION OF THE DRAWINGS

FIG. 4 is a diagram of waveforms for use in describing the embodiment illustrated in FIGS. 2 and 3; and FIG. 5 is a diagram of waveforms for use in describing another embodiment of the present invention.

DESCRIPTION OF THE PREFERRED EMBODIMENTS

Figure 1:
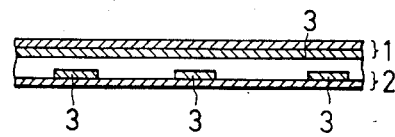
FIG. 1 shows the construction of a matrix switch using transparent conductive sheets.
Figure 2:
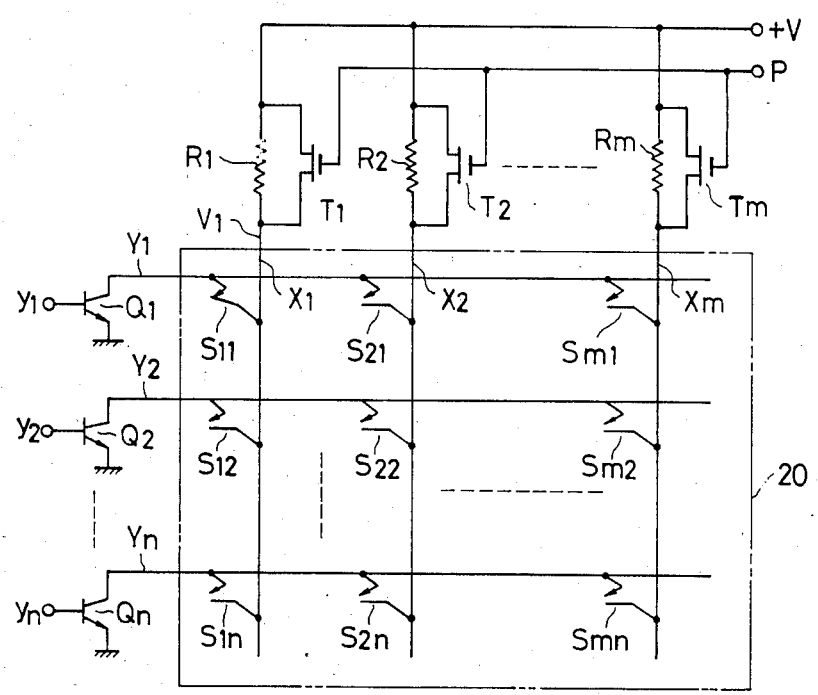
FIG. 2 is a circuit diagram of a matrix switch, to which an embodiment of the present invention is applied, and its surroundings.

An embodiment of the present invention will now be described. FIG. 2 is a circuit diagram of a matrix switch and its surroundings. Reference numeral 20 denotes a matrix switch made by laminating transparent conductive sheets on which, for example, indium oxide mentioned above is evaporated. Reference letters $Y_1$-$Y_n$ denote driving lines (Y lines), and $X_1$-$X_m$ sense lines (X lines), contacts $S_{11}$-$S_{mn}$ being formed on the intersections thereof (crossings of grids in an XY matrix). These contacts $S_{11}$-$S_{mn}$ are closed when they are pressed.

The driving lines $Y_1$-$Y_n$ are grounded through bipolar transistors $Q_1$-$Q_n$ which are driven by scanning pulses $y_1$-$y_n$, and the sense lines $X_1$-$X_m$ are connected to a potential point of $+V$ through resistors $R_1$-$R_m$ for use in pulling up the sense lines $X_1$-$X_m$. The resistance values of these resistors $R_1$-$R_m$ are set selectively to levels sufficiently higher than (for example, 5–10 times) those of the contacts $S_{11}$-$S_{mn}$ in an ON-state.

Figure 3:
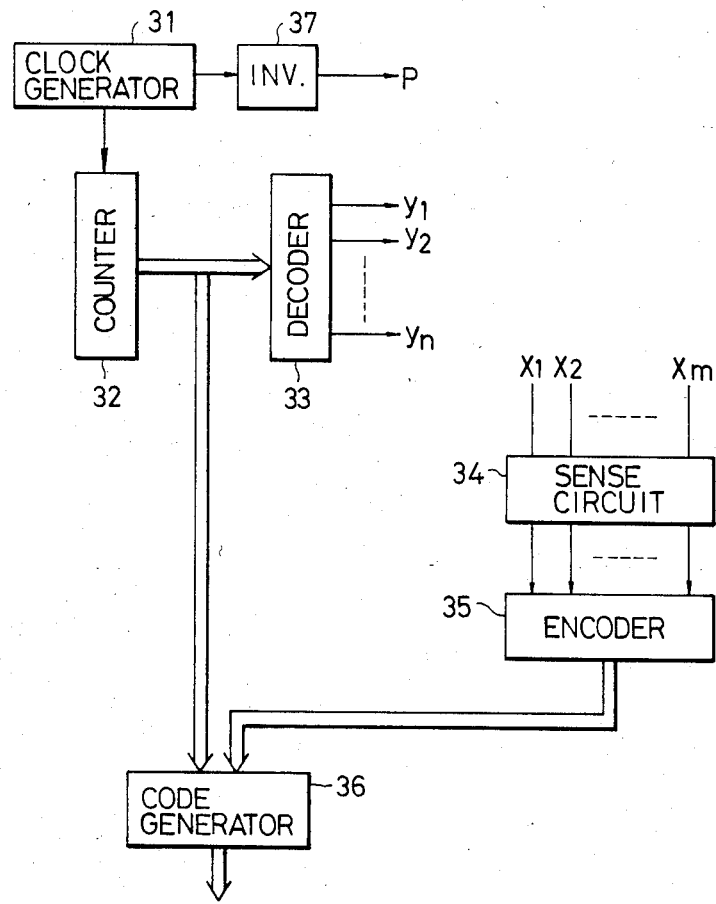
FIG. 3 is a diagram of a control circuit for actuating the circuit shown in FIG. 2.

FIG. 3 is a diagram of a control circuit for actuating the circuit shown in FIG. 2. Referring to the drawing, reference numeral 31 denotes a clock pulse generator adapted to generate a clock pulse CL of a predetermined cycle, 32 a counter adapted to count the clock pulse CL from the clock pulse generator 31 up to $0 \sim n-1$, 33 a decoder having n output lines connected to the bipolar transistors $Q_1$-$Q_n$ shown in FIG. 2, and adapted to decode the content of the counter 32 and output a scanning pulse to an output line corresponding to the counted value, 34 a sense circuit having m output lines, and adapted to compare the output levels in the sense lines (X lines) $X_1$-$X_m$ with a predetermined judgement threshold value Vth and output a signal to an output line corresponding to a sense line (X line) which has an output level which exceeds the threshold value Vth, 35 an encoder having m input lines connected to the sense circuit 34 and adapted to generate a code corresponding to an input line from which a signal has been outputted, and 36 a code generator adapted to take therein an output from the counter 32 as an upper bit and an output from the encoder 35 as a lower bit when a code is generated in the encoder 35, and send the bits as one code to the outside.

According to the present invention, field-effect transistors $T_1$-$T_m$ in particular are parallel-connected to the resistors $R_1$-$R_m$ as shown in FIG. 2. Such transistors are selected as the field-effect transistors $T_1$-$T_m$ as have a resistance value, which is sufficiently smaller than that of the resistors $R_1$-$R_m$, between a drain and a source while the transistors are in an ON-state. Reference letter P denotes a control pulse for turning on and off the field-effect transistors $T_1$-$T_m$ at once. A pulse obtained by reversing a clock pulse CL from the clock generator 31 by an inverter 37 as shown in FIG. 3 is used as the control pulse P.

FIG. 4 is a diagram of waveforms for use in describing the operation of this embodiment. The operation of the embodiment will be described with reference to this drawing.

The bipolar transistors $Q_1$-$Q_n$ are turned on in order by the scanning pulses $y_1$-$y_n$ shown in the drawing, and the driving lines $Y_1$-$Y_n$ are grounded in order. When all of the contacts $S_{11}$-$S_{mn}$ are opened, the driving lines $Y_1$-$Y_n$ and sense lines $X_1$-$X_n$ are opened. Accordingly, the electric potentials of all of the sense lines are left pulled up to the level $+V$.

When the bipolar transistor $Q_1$ is turned on with the contact $S_{11}$ alone closed, the electric potential $v_1$ of the sense line $X_1$ lowers to substantially $0^v$, i.e. becomes lower than a judgement threshold value $v_{th}$ for the sense circuit 34 connected to the sense line $X_1$. Consequently, a signal is outputted from the sense circuit 34 to an output line corresponding to the sense line $X_1$.

When the bipolar transistor $Q_1$ is then turned off with the bipolar transistor $Q_2$ on the subsequent driving line $Y_2$ turned on, the electric potential of the sense line $X_1$ is pulled up toward the level $+V$. If the field-effect transistor $T_1$ shown in FIG. 2 is not provided, the electric potential $v_1$ of the sense line $X_1$ increases slowly as shown by a curve, which is drawn by a chain line 40 in the figure, of a time constant determined by the sense line $X_1$ and resistor $R_1$. Even at an instant at which the bipolar transistor $Q_2$ is turned on, $v_1 < v_{th}$. Therefore, a signal is outputted from the sense circuit 34 to an output line corresponding to the sense line $X_1$, so that the contact $S_{12}$ is detected erroneously as a closed contact. There is a method of preventing this inconvenience by turning on the bipolar transistor $Q_2$ a considerable period of time after the bipolar transistor $Q_1$ has been turned off. However, in this method, the speed of scanning the matrix switch 20 decreases greatly.

On the other hand, when the field-effect transistor $T_1$ is provided as shown in FIG. 2, it is turned on when the control pulse P is in a high level, so that the portion of the circuit which is between both ends of the resistor $R_1$ is short-circuited. As a result, the electric potential $v_1$ of the sense line $X_1$ increases rapidly, and $v_1$ becomes higher than $v_{th}$ at the time of operation of the bipolar transistor $Q_2$. Accordingly, the contact $S_{12}$ is not detected erroneously as a closed contact. The operations of the field-effect transistors $T_2$-$T_m$ are completely the same as that of the field-effect transistor $T_1$, and the description thereof will be omitted.

Thus, the matrix switch 20 can be scanned at a high speed by the scanning pulses $y_1$-$y_n$ having the timing of generation shown in the drawing.

FIG. 5 is a diagram of waveforms for use in describing another embodiment of the present invention. This embodiment has the same circuit construction as the previously-described embodiment. In the second embodiment, the timing of generation of the scanning pulses $y_1$-$y_n$ is changed in such a manner that the quiescent time $\Delta T$ is provided among these pulses with the timing of the control pulse P also changed in such a manner that the field-effect transistors $T_1$-$T_m$ can be turned on during the quiescent time $\Delta T$. Such changes can be attained by constructing the circuit in FIG. 3 in such a manner that AND-gates to which the clock pulse CL is applied as one of inputs thereinto are connected to the output lines of the decoder 33 so as to be turned on when the clock pulse CL is in a high level. Since the electric potential of sense lines $X_1$-$X_m$ in this embodiment is also pulled up rapidly to the level $+V$ during the quiescent time $\Delta T$, the same effect as in the previously-described embodiment can be obtained.

The field-effect transistors $T_1$-$T_m$ may not necessarily be operated through the whole of the quiescent time $\Delta T$; they may be operated for a part of the quiescent time, which is long enough to pull up the electric potential $X_1$-$X_m$ to not lower than $v_{th}$.

In the above-described embodiment, the field-effect transistors $T_1$-$T_m$ and bipolar transistors $Q_1$-$Q_n$ may be substituted by other suitable switching elements. The driving lines $Y_1$-$Y_n$ may be connected to suitable potential points instead of being grounded by switching elements. Also, the end portions of the sense lines $X_1$-$X_m$ which are on the side of the sense circuit may be terminated by being connected in a resistor-suspended state.

According to the present invention described above, closed contacts in even a matrix switch having a high resistance value while the contacts are in an ON-state can be detected correctly as the matrix switch is scanned at a high speed.

I claim:

1. A matrix switch apparatus comprising:
   one or more sense lines each connected to a first potential through a corresponding resistance means;
   one or more driving lines;
   means for connecting said driving lines to a second potential in accordance with a predetermined order so that each of said driving lines is connected to said second potential during a predetermined time interval different from time intervals during which other driving lines are connected to said second potential;
   a plurality of contact switches each connected to one of said sense lines and one of said driving lines so that said contact switches, said sense lines and said driving lines form a matrix switch array;
   sensing means connected to said sense lines for detecting whether any of said sense lines has reached a predetermined threshold potential during said predetermined time interval for each of said sense lines;
   one or more switching elements each connected respectively to a corresponding one of said resistance means in parallel; and
   means for simultaneously turning on said switching elements at a predetermined time subsequent to a time when said sensing means detects whether any of said sense lines has reached said predetermined threshold potential during said predetermined time interval for each of said sense lines for bypassing the resistance means to restore a sense line which has reached said predetermined threshold potential to a predetermined voltage different from said predetermined threshold potential.

2. A matrix switch apparatus according to claim 1, wherein said switching elements are simultaneously turned on and off by a repeat pulse.

3. A matrix switch apparatus according to claim 1, wherein said switching elements are simultaneously turned on subsequent to said predetermined time interval for each of said sense lines.

4. A matrix switch apparatus according to claim 1, wherein said switching elements are simultaneously turned on during said predetermined time interval for each of said sense lines.

5. A matrix switch apparatus according to claim 1, further comprising:
   a clock pulse generator for generating a clock pulse with a predetermined cycle;
   a counter connected to said clock pulse generator and including means for counting said clock pulses generated from said clock pulse generator; and
   a decoder connected between said counter and said driving lines and including means to periodically couple each driving line with said second potential.

6. A matrix switch apparatus according to claim 1, wherein said sensing means includes:
   a sense circuit connected to said sense lines and including means for comparing each potential level of said sense lines with said threshold potential to output a signal corresponding to a sense line having a potential level which has reached said threshold potential; and
   an encoder connected to said sense circuit and including means for generating a code corresponding to said sense line which has reached said threshold potential.

7. A matrix switch apparatus according to claim 5, further comprising a code generator connected to said counter and said encoder and including means for combining an output of said counter with an output of said encoder to form a single code.

* * * * *